(12) United States Patent
Saito et al.

(10) Patent No.: US 8,928,001 B2
(45) Date of Patent: Jan. 6, 2015

(54) GROUP III NITRIDE COMPOUND SEMICONDUCTOR LIGHT EMITTING ELEMENT AND METHOD FOR PRODUCING THE SAME

(71) Applicant: Toyoda Gosei Co., Ltd., Kiyosu-shi (JP)

(72) Inventors: Yoshiki Saito, Kiyosu (JP); Yasuhisa Ushida, Kiyosu (JP); Masato Aoki, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/784,583

(22) Filed: Mar. 4, 2013

(65) Prior Publication Data

US 2013/0256687 A1    Oct. 3, 2013

(30) Foreign Application Priority Data

Mar. 28, 2012 (JP) ................................. 2012-073622

(51) Int. Cl.
*H01L 33/32* (2010.01)
*H01L 33/12* (2010.01)
*H01L 33/00* (2010.01)

(52) U.S. Cl.
CPC ............... *H01L 33/32* (2013.01); *H01L 33/12* (2013.01); *H01L 33/0079* (2013.01); *H01L 33/0075* (2013.01)
USPC ............................................. 257/76; 438/47

(58) Field of Classification Search
CPC ........ B82Y 20/00; H01L 33/04; H01L 33/32; H01L 33/06
USPC ................................................................. 257/94
See application file for complete search history.

(56) References Cited

U.S. PATENT DOCUMENTS

| 2005/0127394 | A1* | 6/2005 | Nagahama et al. | 257/103 |
| 2009/0026440 | A1* | 1/2009 | Kyono et al. | 257/13 |
| 2011/0073892 | A1* | 3/2011 | Kyono | 257/98 |
| 2012/0100654 | A1* | 4/2012 | Takagi et al. | 438/46 |

FOREIGN PATENT DOCUMENTS

| JP | 10-335757 A | 12/1998 |
| JP | 2011-77351 A | 4/2011 |

OTHER PUBLICATIONS

Japanese Office Action dated Jul. 29, 2014 with English Translation.

* cited by examiner

*Primary Examiner* — David Vu
*Assistant Examiner* — Jonathan Han
(74) *Attorney, Agent, or Firm* — McGinn IP Law Group, PLLC

(57) ABSTRACT

A group III nitride compound semiconductor light emitting device that inhibits occurrence of dislocation in a strain relaxation layer in forming a group III nitride compound semiconductor layer on a thin GaN substrate, and a method for producing the same are provided. A light emitting device 100 comprises a support substrate 10, a GaN substrate 20, an n-type contact layer 30, a strain relaxation layer 40 (n-type InGaN layer), a light emitting layer 50, a p-type clad layer 60, and a p-type contact layer 70. The GaN substrate 20 has a thickness in a range of from 10 nm to 10 μm. The strain relaxation layer 40 (n-type InGaN layer) has an In composition ratio X in a range of from larger than 0 to 3%.

11 Claims, 13 Drawing Sheets

GROUP III NITRIDE COMPOUND SEMICONDUCTOR LIGHT EMITTING ELEMENT AND METHOD FOR PRODUCING THE SAME

BACKGROUND OF THE INVENTION

1. Field of the Invention

The present invention relates to a group III nitride compound semiconductor light emitting device and a method for producing the same. In more detail, the invention relates to a group III nitride compound semiconductor light emitting device having a group III nitride compound semiconductor layer formed on a GaN substrate, and a method for producing the same.

2. Description of the Relate Art

A method for preparing a semiconductor crystal includes a vapor phase epitaxial method such as a metal organic chemical vapor deposition method (MOCVD) or a halide vapor phase epitaxy method (HVPE); a molecular beam epitaxy method (MBE), a pulsed sputtering deposition method (PSD) and a liquid phase epitaxy method.

For example, in the case of forming a group III nitride compound semiconductor by an MOCVD method, each layer is formed on a growth substrate. Examples of the growth substrate frequently used include a sapphire substrate having a buffer layer formed thereon (for example, see paragraph 0020 and FIG. 1 of JP-A-10-335757) and a free-standing GaN substrate (for example, see paragraph 0116 and FIG. 4 of JP-A-10-335757).

SUMMARY OF THE INVENTION

However, it is not easy to produce the free-standing GaN substrate having large thickness and sufficient strength. For this reason, such the free-standing GaN substrate is expensive. Therefore, a substrate comprising a sufficiently thick support substrate and a thin GaN substrate adhered thereto is sometimes used. In this case, a group III nitride compound semiconductor is grown from the thin GaN substrate.

As a result of intensive investigations by the present inventors, it was clarified that in the case of growing an n-type InGaN layer (strain relaxation layer) using the thin GaN substrate as a growth substrate, dislocation is easy to occur from the n-type GaN layer. The details are described hereinafter. Crystal of a nitride compound semiconductor light emitting device has poor quality by the increase in dislocation. For this reason, in the case of using the thin GaN substrate as the growth substrate, a technology of inhibiting occurrence of dislocation is required.

The present invention has been made to solve the above problems of the prior art. Accordingly, an object of the present invention is to provide a group III nitride compound semiconductor light emitting device that inhibits occurrence of dislocation in a strain relaxation layer in forming a group III nitride compound semiconductor layer on the thin GaN substrate, and a method for producing the same.

A group III nitride compound semiconductor light emitting device according to a first embodiment comprises a GaN substrate, a support substrate supporting the GaN substrate, a light emitting layer, a first conductive semiconductor layer formed between the GaN substrate and the light emitting layer, and a second conductive semiconductor layer formed at a side opposite to the first conductive semiconductor layer through the light emitting layer. The GaN substrate has a thickness in a range of from 10 nm to 10 µm. The first conductive semiconductor layer contains an InGaN layer. The InGaN layer has an In composition ratio X in a range of from larger than 0 to 3%.

The group III nitride compound semiconductor light emitting device is produced using a thin GaN substrate as a growth substrate. In the group III nitride compound semiconductor light emitting device, the value of In composition ratio in the InGaN layer is small. For this reason, difference in lattice constant between the thin GaN substrate and the InGaN layer is small. Therefore, stress concentration due to the difference in lattice constant can be relaxed. As a result, occurrence of dislocation due to stress concentration can be inhibited. In other words, even though a thin GaN substrate is used, dislocation due to strain does not almost occur in the InGaN layer.

In the group III nitride compound semiconductor light emitting device according to a second embodiment, the InGaN layer is an n-type InGaN layer. The n-type InGaN layer has the In composition ration X in a range of from 0.1 to 2%. When the In composition ratio X falls within the range, occurrence of dislocation in the InGaN layer can further be inhibited.

The group III nitride compound semiconductor light emitting device according to a third embodiment is that the GaN substrate has a thickness in a range of from 100 to 200 nm. Even though the thickness of the GaN substrate is small, occurrence of dislocation in the InGaN layer can well be inhibited.

A method for producing a group III nitride compound semiconductor light emitting device according to a fourth embodiment is a method comprising a GaN substrate fixing step of fixing a GaN substrate to a support substrate, a first conductive semiconductor layer forming step of forming a first conductive semiconductor layer containing an InGaN layer, a light emitting layer forming step of forming a light emitting layer, and a second conductive semiconductor layer forming step of forming a second conductive semiconductor layer having a polarity different from that of the first conductive semiconductor layer. The GaN substrate fixing step uses a GaN substrate having a thickness in a range of from 10 nm to 10 µm. The first conductive semiconductor layer forming step forms the InGaN layer having an In composition ratio X in a range of from larger 0 to 3%.

The method for producing a group III nitride compound semiconductor light emitting device uses a thin GaN substrate as a growth substrate. The InGaN layer formed has small value of the In composition ratio. For this reason, difference in lattice constant between the thin GaN substrate and the InGaN layer is small. Therefore, stress concentration due to the difference in lattice constant can be relaxed. As a result, occurrence of dislocation due to stress concentration can be inhibited. In other words, even though a thin GaN substrate is used, dislocation due to strain does not almost occur in the InGaN layer.

In the method for producing a group III nitride compound semiconductor light emitting device according to a fifth embodiment, the first conductive semiconductor layer forming step forms an n-type InGaN layer as the InGaN layer. The n-type InGaN layer has the In composition ratio X in a range of from 0.1 to 2%. When the composition ratio X falls within the range, occurrence of dislocation in the InGaN layer can further be inhibited.

In the method for producing a group III nitride compound semiconductor light emitting device according to a sixth embodiment, the GaN substrate used has a thickness in a range of from 100 to 200 nm. Even though the thickness of the GaN substrate is small, occurrence of dislocation in the InGaN layer can further be inhibited.

According to the present invention, a group III nitride compound semiconductor light emitting device that inhibits occurrence of dislocation in a strain relaxation layer in forming a group III compound semiconductor layer on a thin GaN substrate, and a method for producing the same are provided.

DESCRIPTION OF THE PREFERRED EMBODIMENTS

Specific embodiments are described below by reference to the drawings. However, those embodiments are exemplary examples, and the present invention is not limited to those embodiments. Thickness of each layer shown in the respective drawings is a conceptual thickness, and does not show the actual thickness.

1. Semiconductor Light Emitting Device

Figure 1:
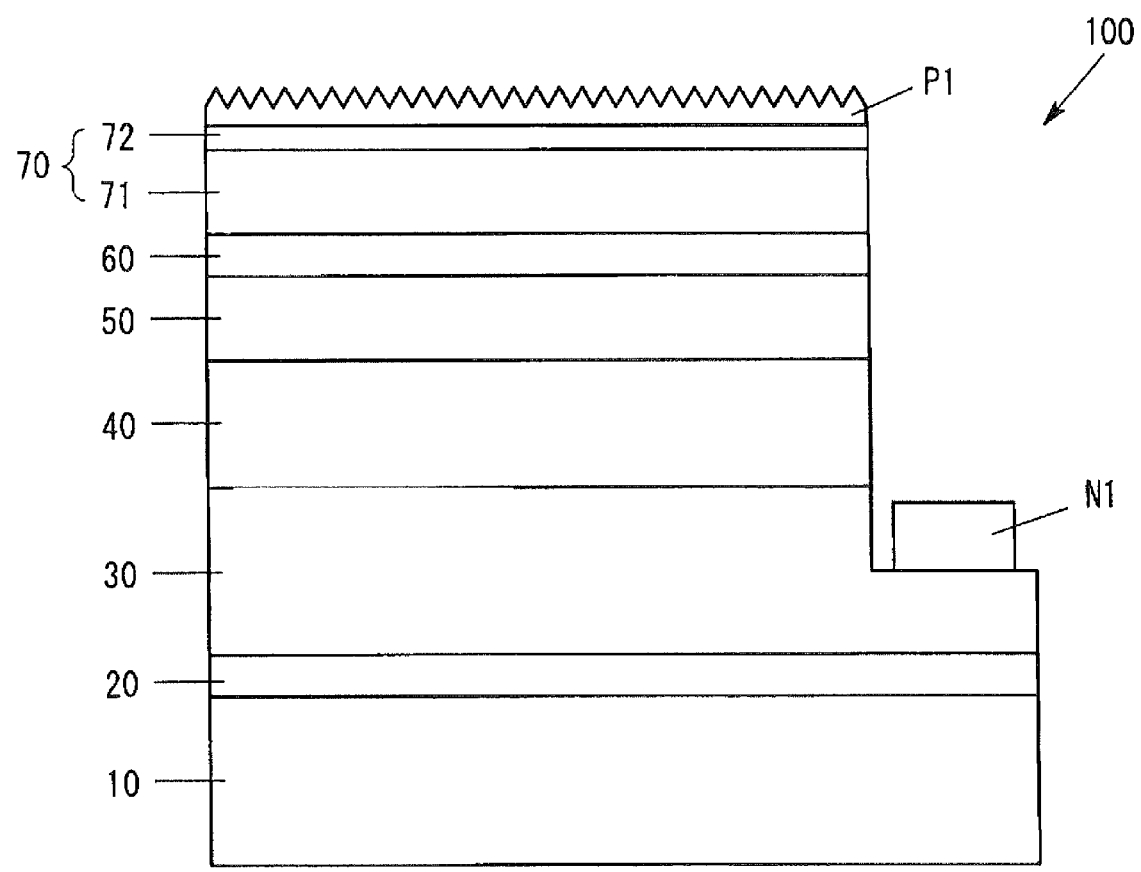
FIG. 1 is a view for explaining the group III nitride compound semiconductor light emitting device according to the embodiment.

A light emitting device 100 according to the embodiment is described by reference to FIG. 1. The light emitting device 100 is a semiconductor light emitting device comprising a group III nitride compound semiconductor. As shown in FIG. 1, the light emitting device 100 comprises a support substrate 10, a GaN substrate 20, an n-type contact layer 30, a strain relaxation layer 40, a light emitting layer 50, a p-type clad layer 60, and a p-type contact layer 70. The light emitting layer 100 has a non-through-hole for exposing the n-type contact layer 30 in a thickness direction of each layer. The n-type contact layer 30 has an n-electrode N1 formed thereon. The p-type contact layer 70 has a p-electrode P1 formed thereon. An n-type layer is formed between the GaN substrate 20 and the light emitting layer 50, and a p-type layer is formed at a side opposite to the n-type layer through the light emitting layer 50.

The support substrate 10 is a substrate for imparting strength to the light emitting layer 100. Furthermore, the support substrate 10 is a substrate for supporting the GaN substrate 20. The GaN layer 20 is a growth substrate for forming a group III nitride semiconductor layer on the upper thereof. The GaN substrate 20 is adhered to the support substrate 10.

The n-type contact layer 30 is a layer actually contacting the n-electrode N1. The n-type contact layer 30 is a layer comprising n-type GaN. Its Si concentration is $1 \times 10^{18}/cm^3$ or more. The n-type contact layer 30 may comprise a plurality of layers having different carrier concentration. Such an n-type contact layer improves ohmic property to the n-electrode.

The strain relaxation layer 40 is a layer for relaxing stress added to the light emitting layer 50. The strain relaxation layer 40 is an n-type InGaN layer. An In composition ratio in the strain relaxation layer 40 is described in detail hereinafter. In doping Si, a carrier layer is $1 \times 10^{17}/cm^3$ or less.

The light emitting layer 50 is a layer emitting light by recombining an electron and a hole. The light emitting layer 50 has a multiquantum well structure (MQW structure) comprising unit laminate structures repeatedly laminated. The unit laminate structure used herein means a structure that an InGaN layer, a GaN layer and an AlGaN layer are laminated from the bottom in this order. The number of repetition of the unit laminate structure is 9 times. The number of repetition may be changed in a range of from 5 to 12 times. The number of repetition may be the number other this. Furthermore, the order of lamination of each layer in the unit laminate structure may be changed. The unit laminate structure itself can use a unit lamination structure other than the above. In this case, GaN, InGaN, AlGaN and AlInGaN may freely be combined.

The p-type clad layer 60 is a layer for preventing electrons from being diffused in the n-type contact layer 70. The p-type clad layer 60 is a layer comprising a p-type AlGaN. Alternatively, the p-type clad layer 60 may be a layer obtained by using a layer comprising a p-type InGaN and a layer comprising a p-type AlGaN as a unit structure, and repeatedly laminating the unit structures. The number of repetition is, for example, 7 times. The number of repetition may be in a range of from 3 to 15 times.

The p-type contact layer 70 is a layer for achieving ohmic contact with the p-electrode P1. The p-type contact layer 70 comprises a first p-type contact layer 71 and a second p-type contact layer 72. The first p-type contact layer 71 and the second p-type contact layer 72 each are layers comprising p-type GaN doped with Mg. Of those layers, the first p-type contact layer 71 is positioned as a layer lower than the second p-type contact layer 72. A layer actually contacting the p-electrode P1 is the second p-type contact layer 72.

The amount of Mg doped in the first p-type contact layer 71 is a range of from $1\times10^{19}$ to $1\times10^{20}/cm^3$. The range of the Mg concentration is a range that high hole concentration is obtained without decreasing crystallinity. The amount of Mg doped in the second p-type contact layer 72 is a range of from $1\times10^{20}$ to $1\times10^{22}/cm^3$. Thus, the amount of Mg doped in the second p-type contact layer 72 is larger than the amount of Mg doped in the first p-type contact layer 71.

2. Thickness of Each Layer in Semiconductor Light Emitting Device

Thickness of each layer is described below. The support substrate 10 has a thickness of, for example, 2 mm. The thickness may be changed in a range of from 1 to 3 mm. The GaN substrate 20 has a thickness of, for example, 150 nm. The thickness is a range of from 10 nm to 10 µm. The thickness may be changed in a range of from 100 to 2,000 nm. The n-type contact layer 30 has a thickness of 20,000 angstroms, but may of course have a thickness other than this value.

The strain relaxation layer 40 has a thickness of 1,500 angstroms, but may have a thickness other than this value. A value of total radiant flux (Normalized Po) when the thickness of the strain relaxation layer 40 is 1,500 angstroms is considered as 100%. When the total radiant flux is used as a standard value, the thickness of the strain relaxation layer 40 is a range of from 500 to 2,500 angstroms in order to obtain the total radiant flux of 95% or more of the standard value. Furthermore, the thickness of the strain relaxation layer 40 is a range of from 1,000 to 2,000 angstroms in order to obtain the total radiant flux of 99% or more of the standard value.

In the light emitting layer 50, the InGaN layer has a thickness of 32 angstroms, the GaN layer has a thickness of 15 angstroms, and the AlGaN layer has a thickness of 22.5 angstroms. The p-type clad layer 60 has a thickness of 100 angstroms. The first p-type contact layer 71 has a thickness of 800 angstroms. The second p-type contact layer 72 has a thickness of 50 angstroms. Of course, those layers may have thicknesses other than the above values.

3. In Composition Ratio in Strain Relaxation Layer (N-Type Ingan Layer)

The In composition ratio in the strain relaxation layer 40 (n-type InGaN layer) is described below. The In composition ratio in the strain relaxation layer 40 (n-type InGaN layer) is a range of from larger than 0 to 3% as shown in Table 1. The In composition ratio in the strain relaxation layer 40 (n-type InGaN layer) is more preferably a range of from 0.1 to 2.0% as shown in Table 2. The In composition ratio in the strain relaxation layer 40 (n-type InGaN layer) is still more preferably a range of from 0.5 to 1.5% as shown in Table 3. Those ranges are described in detail hereinafter.

[Table 1]
In composition ratio X in strain relaxation layer: $0\% < X \leq 3.0\%$

[Table 2]
In composition ratio X in strain relaxation layer: $0.1\% \leq X \leq 2.0\%$ In composition ratio X in strain relaxation layer: $0.5\% \leq X \leq 1.5\%$

4. Production Method of Semiconductor Light Emitting Device

A method for producing a semiconductor light emitting device according to the embodiment is described below.

4-1. (A) GaN Substrate Fixing Step

Figure 2:
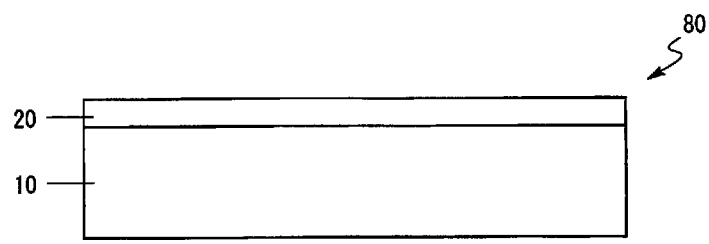
FIG. 2 is one view for explaining the method for producing a group III nitride compound semiconductor light emitting device according to the embodiment.

The GaN substrate 20 is adhered to the support substrate 10. To achieve this, an adhesive is used. Thus, a substrate body 80 comprising the support substrate 10 and the GaN substrate 20 adhered and fixed thereto is obtained as shown in FIG. 2.

4-2. (B) Semiconductor Layer Forming Step

Crystal on each layer above is epitaxially grown. A method of epitaxial growth uses a metal organic chemical vapor deposition method (MOCVD). A vapor phase epitaxial method such as a halide vapor phase epitaxy method (HVPE); a molecular beam epitaxy method (MBE); a liquid phase epitaxy method; and the like may be used.

The carrier gas used is hydrogen ($H_2$), nitrogen ($N_2$) or a mixed gas of hydrogen and nitrogen ($H_2+N_2$). Ammonia gas (NH3) can be used as a nitrogen source. Trimethyl gallium ($Ga(CH_3)_3$: hereinafter referred to as "TMG") can be used as a Ga source. Trimethyl indium ($In(CH_3)_3$: hereinafter referred to as "TMI") can be used as an In source. Trimethyl aluminum ($Al(CH_3)_3$: hereinafter referred to as "TMA") can be used as an Al source. Silane ($SiH_4$) can be used as an n-type dopant gas. Cyclopentadienyl magnesium ($Mg(C_5H_5)_2$: hereinafter referred to as "$CP_2Mg$") can be used as a p-type dopant gas.

4-2-1. (B-1) n-Type Contact Layer Forming Step

Figure 3:
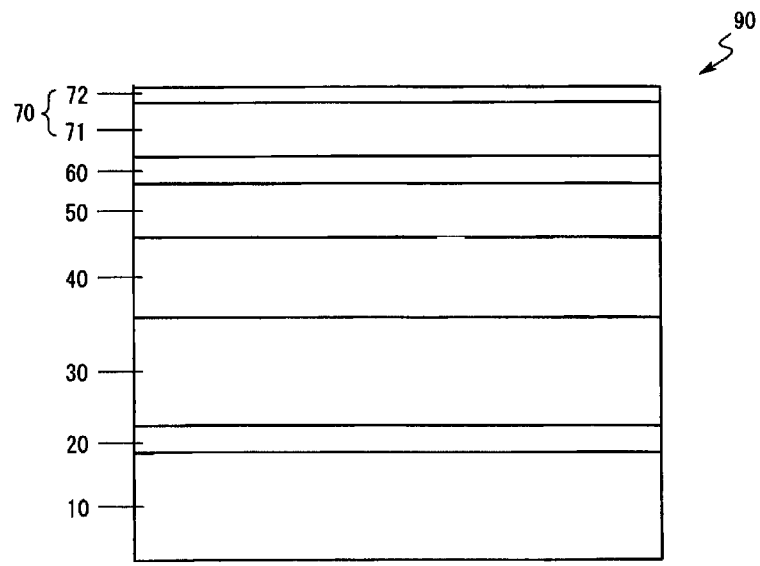
FIG. 3 is another view for explaining the method for producing a group III nitride compound semiconductor light emitting device according to the embodiment.

The n-type contact layer 30 is formed on the GaN layer (see FIG. 3). Substrate temperature is increased to 1,100° C. while flowing hydrogen gas as a carrier gas, and ammonia gas. When the substrate temperature has reached 1,100° C., TMG, ammonia gas and silane gas as an impurity gas are supplied. Thus, the n-type contact layer 30 is formed.

4-2-2. (B-2) Strain Relaxation Layer Forming Step

The strain relaxation layer 40 is formed on the n-type contact layer 30. The In composition ratio in the strain relaxation layer 40 (n-type InGaN layer) is a range shown in Tables 1 to 3, as described before. In forming the n-type InGaN layer, the substrate temperature is set to 830° C., and silane gas, TMG, TMI and ammonia are supplied.

4-2-3. (B-3) Light Emitting Layer Forming Step

The light emitting layer 50 is formed on the strain relaxation layer 40. To achieve this, unit laminate structure is repeatedly formed. The number of repetition is as described before. The unit laminate structure is a structure that an InGaN layer, a GaN layer and an AlGaN layer are laminated from the bottom in this order. The InGaN layer is grown at a growth temperature in a range of from 750 to 800° C. To achieve this, raw material gases of TMI, TMG and ammonia are supplied. The AlGaN layer is grown at a growth temperature in a range of from 850 to 950° C. To achieve this, raw material gases of TMA, TMG and ammonia are supplied.

4-2-4. (B-4) p-Type Clad Layer Forming Step

The n-type clad layer 60 is formed on the light emitting layer 50. In forming a p-type AlGaN layer, the substrate temperature is set to 855° C., and $CP_2Mg$, TMA, TMG and ammonia are supplied. The p-type clad layer 60 may be a repeated structure of a p-type InGaN layer and the n-type AlGaN layer. In this case, in forming the p-type InGaN layer, the substrate temperature is set to 855° C., and $CP_2Mg$, TMI, TMG and ammonia are supplied.

4-2-5. (B-5) p-Type Contact Layer Forming Step

The p-type contact layer 70 is formed on the p-type clad layer 60 (see FIG. 3). The p-type contact layer 70 is p-type GaN. A mixed gas of nitrogen and hydrogen is used as a carrier gas. $CP_2Mg$, TMG and ammonia are used as raw material gases. The temperature for growing crystal is a range of from 900 to 1,050° C. After forming the first p-type contact layer 71, the second p-type contact layer 72 is formed. Thus, a semiconductor layer 90 as shown in FIG. 3 is obtained.

4-3. (C) Electrode Forming Step

Dry etching is conducted from the surface side of the p-type contact layer 70 to form a groove reaching halfway the n-type contact layer 30. The p-electrode P1 is formed on the p-type contact layer 70. A layer comprising ITO is formed as the p-electrode P1 on the p-type contact layer 70. Materials other than ITO may be used. The surface of the p-electrode may be roughened. An n-electrode N1 is formed on the n-type contact layer 30 exposed. An Ni layer and an Au layer are formed as the n-electrode N1 on the n-type contact layer 30 in this order. Materials of those electrodes are exemplary materials, and the materials of the electrodes are not limited to the above-described materials. Thus, the light emitting device 100 shown in FIG. 1 is produced.

Figure 4:
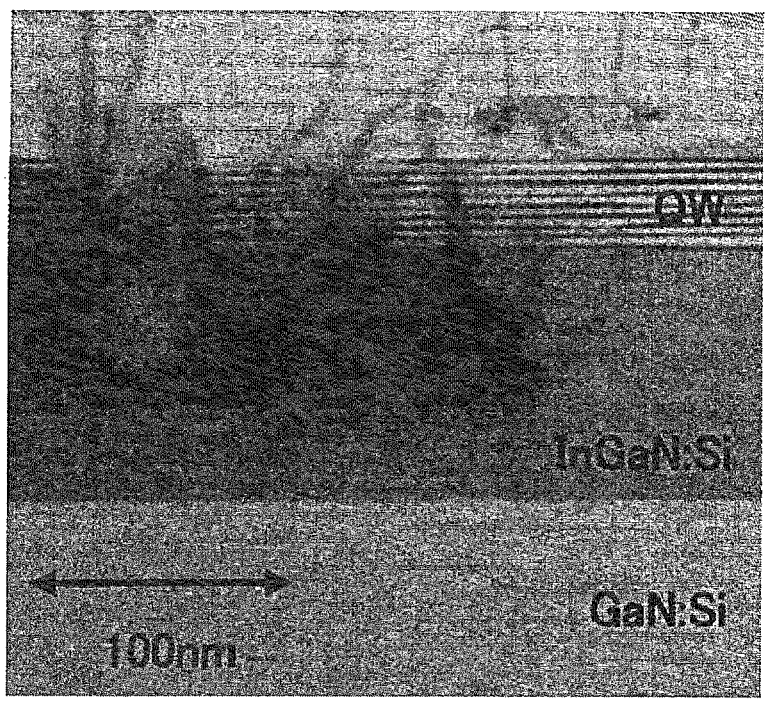
FIG. 4 is a TEM photograph in a light emitting device having an InGaN layer with an In composition ratio of 6.5% on a thin GaN substrate.

5. Experiment 5-1. Dislocation Generated in the Case of using Thin Growth Substrate Dislocation in the light emitting device using a thin growth substrate is described below. The case that a thin GaN substrate has been used as the growth substrate is described. FIG. 4 is a TEM photograph in the case that the n-type InGaN layer having an In composition ratio of 6.5% has been formed on the thin GaN substrate. As shown in FIG. 4, dislocation occurs from the n-type InGaN layer. On the other hand, in the case that a thick GaN substrate has been used, the dislocation did not occur. In other words, when the thin GaN substrate is used, dislocation is easy to occur from the InGaN layer. The reason is described below.

Lattice defect is small in a GaN substrate having low dislocation density. For this reason, the degree of stress relaxation by lattice defect is small. Therefore, in the case that the GaN substrate as a growth substrate is thin, it is difficult to bridge the difference in lattice constant between GaN of the GaN substrate and the InGaN layer. As a result, dislocation occurs by the strain that could not be relaxed.

Figure 5:
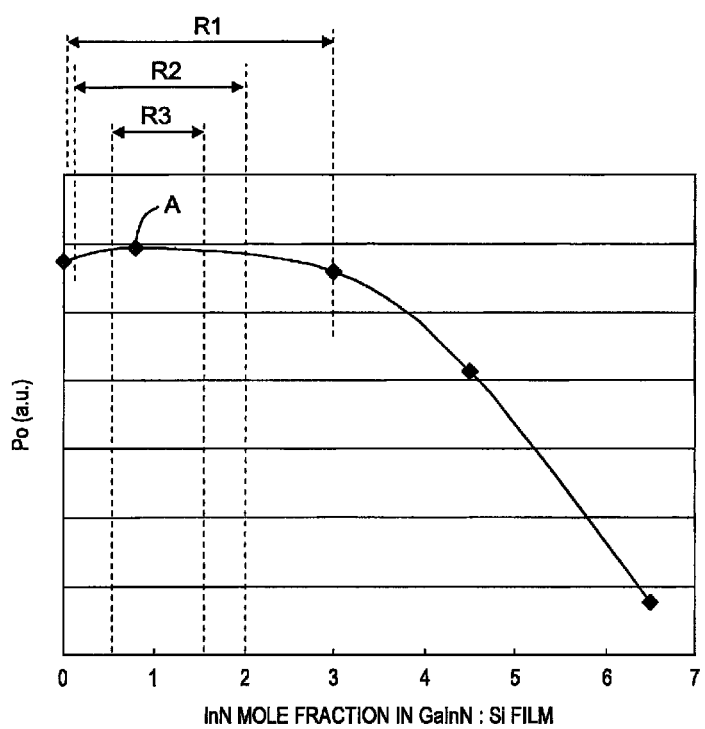
FIG. 5 is a graph showing total radiant flux when an In composition ratio in an InGaN layer was changed in a light emitting layer in which each semiconductor layer formed was formed on a thin GaN substrate.

5-2. Relationship Between In Composition Ratio in Strain Relaxation Layer (n-Type InGaN Layer) and Total Radiant Flux FIG. 5 shows the relationship between an In composition ratio (InN mole fraction (%) in GaInN:Si film) in the strain relaxation layer 40 (n-type InGaN layer) and total radiant flux (Po(a.u.)). The horizontal axis in FIG. 5 shows the In composition ratio in the strain relaxation layer 40 (n-type InGaN layer). The vertical axis in FIG. 5 shows total radiant flux (Po) of the light emitting layer 100. Of the measurement points, when the In composition ratio in the n-type InGaN layer is 0.8%, the total radiant flux has the largest value. This point is indicated as A.

As shown in FIG. 5, in the case that In is not contained, total radiant flux is slightly decreased as compared with the case when the In composition ratio is 0.8% (point A). Thus, when In is not contained, the effect of relaxing strain by the InGaN layer is not obtained.

On the other hand, when the In composition ratio is larger than 3%, the total radiant flux is small. This is considered for the reason that the In composition ratio is too large, and as a result, crystallinity of the semiconductor light emitting device to be grown is poor. The cause is the possibility that dislocation occurs in the InGaN layer as explained in FIG. 4.

Region R1 in FIG. 5 corresponds to the range (0%<X≤3.0%) of the In composition ratio in Table 1. The total radiant flux in the range of the regions R1 is 98% or more of the total flux at the point A. Region R2 in FIG. 5 corresponds to the range (0.1%≤X≤2.0%) of the In composition ratio in Table 2. The total radiant flux in the range of the region R2 is 99% or more of the total radiant flux at the point A. Region R3 in FIG. 5 corresponds to the range (0.5%≤X≤1.5%) of the In composition ratio in Table 3. The total radiant flux in the range of the region R3 is 99.5% or more of the total radiant flux at the point A.

5-3. Relationship Between Current and Shift Amount of Wavelength

Figure 6:
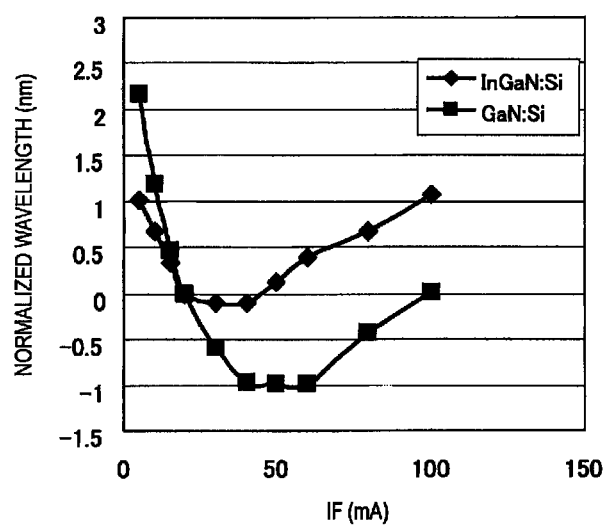
FIG. 6 is a graph showing the relationship between current flowing a light emitting device and a shift amount of emission wavelength.

FIG. 6 shows a graph showing current dependency of shift amount of emission wavelength in the light emitting device 100 when the In composition ratio in the strain relaxation layer 40 (n-type InGaN layer) is 0.8%. The horizontal axis in FIG. 6 shows current (IF (mA)) flowing the light emitting device 100. The vertical axis in FIG. 6 shows shift amount of emission wavelength (Normalized Wavelength Shift (nm)) in the light emitting device 100.

FIG. 6 shows the case that the strain relaxation layer 40 is an n-type InGaN layer (In composition ratio: 0.8%) and the case that the strain relaxation layer 40 is a GaN layer (In composition ratio: 0%). As shown in FIG. 6, the case that the strain relaxation layer is a GaN layer shows large shift amount of emission wavelength as compared with the case that the strain relaxation layer 40 is an n-type InGaN layer. In other words, the case that the strain relaxation layer is an n-type AlGaN layer shows small shift amount of emission wavelength as compared with the case that the strain relaxation layer 40 is a GaN layer. Therefore, the case that the strain relaxation layer is an n-type InGaN layer does not cause unevenness of emission wavelength. This suggests that when the strain relaxation layer is an n-type InGaN layer, strain is relaxed and additionally, occurrence of dislocation in the strain relaxation layer is inhibited. In other words, crystallinity in a semiconductor light emitting device is good as described before.

5-4. Relationship Between Current and Total Radiant Flux

Figure 7:
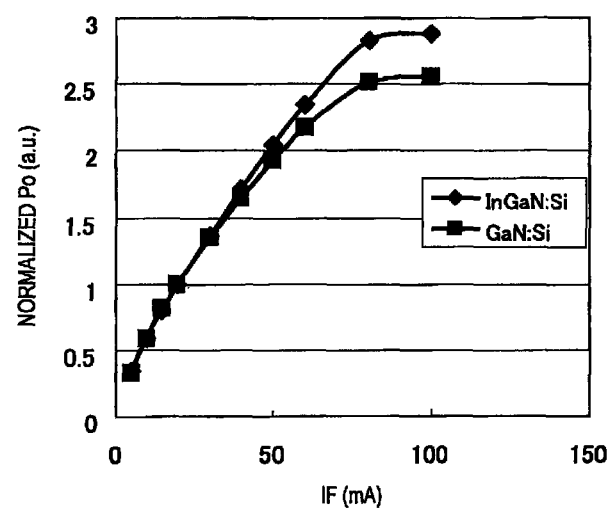
FIG. 7 is a graph showing the relationship between current flowing a light emitting device and total radiant flux.

FIG. 7 shows a graph showing current dependency of total radiant flux (Po) in the light emitting device 100 when the In composition ratio in the strain relaxation layer 40 (n-type InGaN layer) is 0.8%. The horizontal axis in FIG. 7 shows current (IF (mA)) flowing the light emitting device 100. The vertical axis in the FIG. 7 shows total flux (Normalized Po (a.u.)) in the light emitting device 100.

FIG. 7 shows the case that the strain relaxation layer 40 is an n-type InGaN layer (In composition ratio: 0.8%) and the case that the strain relaxation layer 40 is a GaN layer (In composition ratio: 0%). As shown in FIG. 7, the case that the strain relaxation layer is an n-type InGaN layer (In composition ratio: 0.8%) shows good current dependency of the total radiant flux (Po). In other words, the total radiant flux (Normalized Po) is nearly proportionate to the current.

For example, when the current IF (mA) and the total radiant flux (Normalized Po) have a proportional relationship, brightness of the light emitting device 100 can be controlled by adjusting the current IF (mA). In FIG. 7, the case that the In composition ratio is 0.8% shows small deviation from a proportional line in the region that the current IF (mA) is from about 40 to 70 mA, as compared with the case that the In composition ratio is 0%. In other words, the case that the In composition ratio is 0.8% is excellent in controlling brightness of the light emitting device 100, as compared with the case that the In composition ratio is 0%.

Therefore, the case that the relaxation layer is an n-type InGaN layer is easy to control brightness in the case of flowing great current. This result suggests that when the strain relaxation layer is an n-type InGaN layer, strain is relaxed and additionally, occurrence of dislocation in the strain relaxation layer is inhibited. In other words, crystallinity in the semiconductor light emitting device is good as described before.

5-5. Cathode Luminescence Photograph 5-5-1. In Composition Ration 0.8%

Figure 8:
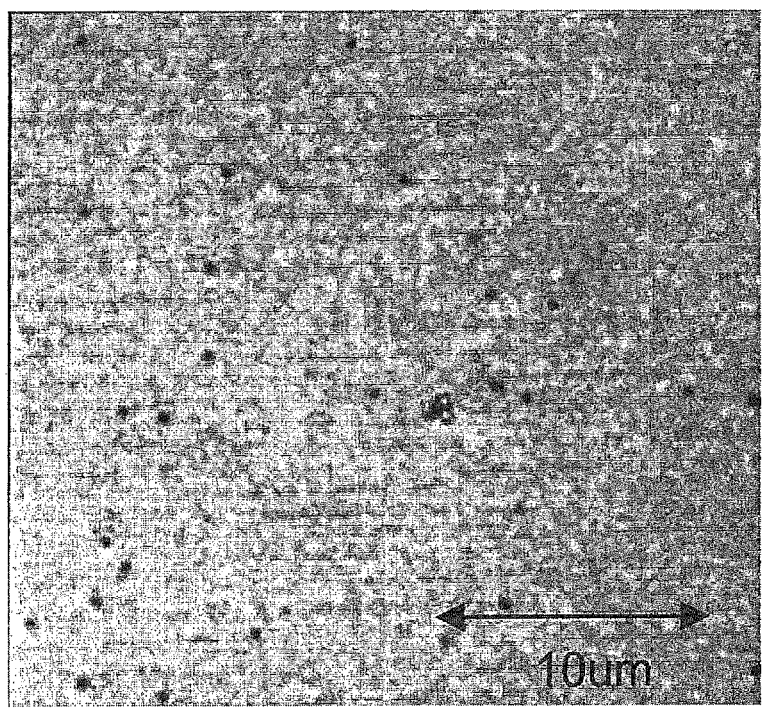
FIG. 8 is a cathode luminescence photograph showing dislocation of an n-type InGaN layer in a light emitting device in which an In composition ratio in an n-type InGaN layer is 0.8%.
Figure 9:
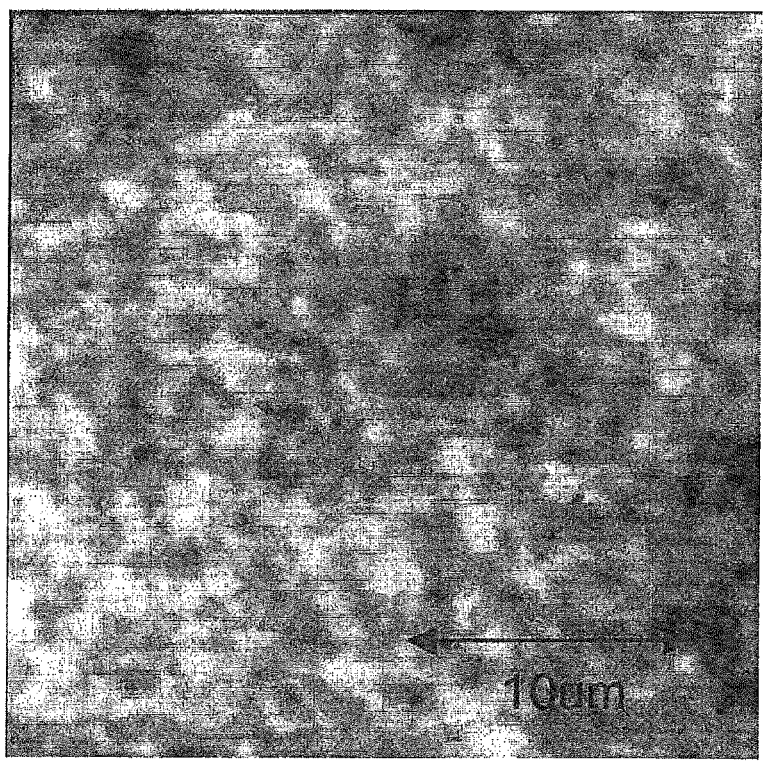
FIG. 9 is a cathode luminescence photograph showing dislocation of a p-type AlGaN layer in a light emitting device in which an In composition ratio in an n-type InGaN layer is 0.8%.

FIGS. 8 and 9 show the experimental result of a light emitting device when a thin GaN substrate was used as a growth substrate. FIG. 8 is a cathode luminescence photograph of an n-type InGaN layer. The In composition ratio in the n-type InGaN layer in this case is 0.8%. From FIG. 8, dislocation density of the n-type InGaN layer was $2 \times 10^6$ cm$^{-2}$. FIG. 9 is a cathode luminescence photograph of a p-type AlGaN layer. The n-type InGaN layer having the In composition ratio of 0.8% is present under the p-type AlGaN layer. From FIG. 9, dislocation density of the p-type AlGaN layer was $2 \times 10^6$ cm$^{-2}$. Thus, the dislocation density of the n-type InGaN layer and the dislocation density of the p-type AlGaN layer are in the same degree. In other words, increase in dislocation was not observed over the p-type AlGaN layer from the n-type InGaN layer.

5-5-2. In Composition Ratio 6.5%

Figure 10:
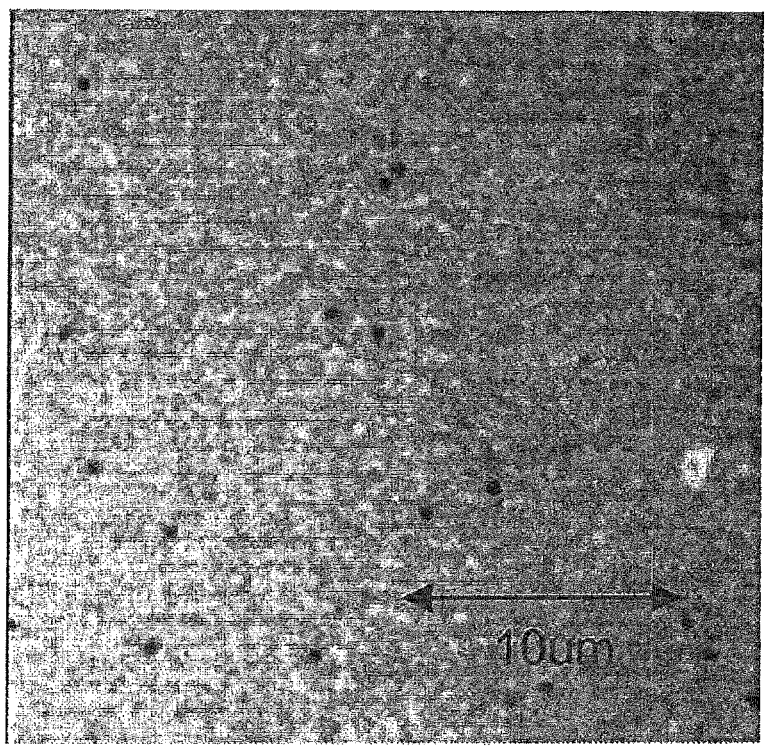
FIG. 10 is a cathode luminescence photograph showing dislocation of an n-type InGaN layer in a light emitting device in which an In composition ratio in the n-type InGaN layer is 6.5%.
Figure 11:
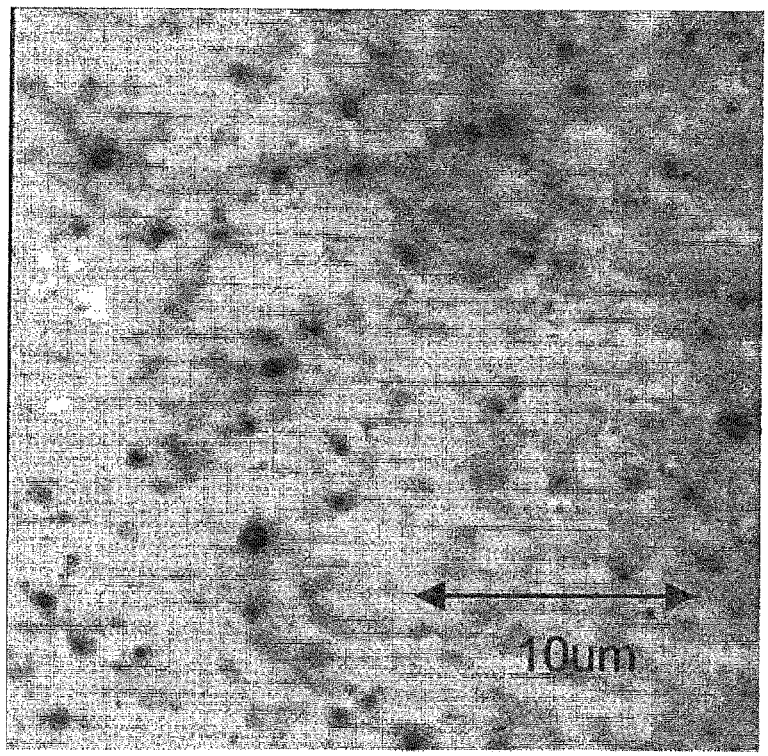
FIG. 11 is a cathode luminescence photograph showing dislocation of a p-type AlGaN layer in a light emitting device in which an In composition ratio in an n-type InGaN layer is 6.5%.

FIGS. 10 and 11 show the experimental result of a light emitting device when a thin GaN substrate was used as a growth substrate. FIG. 10 is a cathode luminescence photograph of an n-type InGaN layer. The In composition ratio in the n-type InGaN layer in this case is 6.5%. From FIG. 10, dislocation density of the n-type InGaN layer was $2 \times 10^6$ cm$^{-2}$. FIG. 11 is a cathode luminescence photograph of a p-type AlGaN layer. The n-type InGaN layer having the In composition ratio of 0.8% is present under the p-type AlGaN layer. From FIG. 11, the dislocation density of the p-type AlGaN layer was $4 \times 10^6$ cm$^{-2}$. Thus, the dislocation density of the p-type AlGaN layer was about 2 times the dislocation density of the n-type InGaN layer. In other words, the dislocation was increased in the semiconductor layer after the n-type AlGaN layer. This result is not inconsistent with the case that dislocation occurred in the n-type InGaN layer as described in FIG. 4.

5-6. Photoluminescence Photograph

Figure 12:
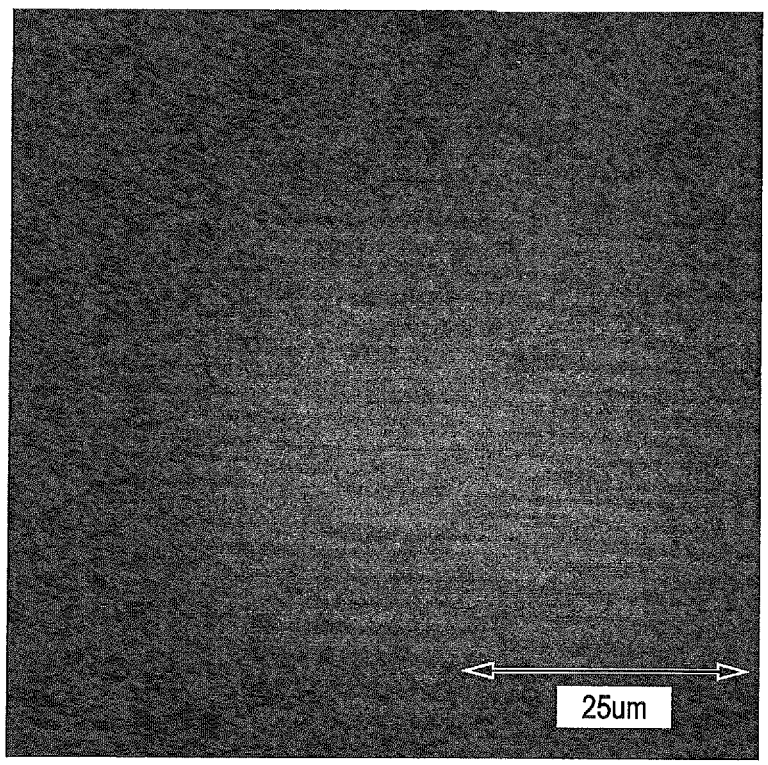
FIG. 12 is a photoluminescence photograph when an In composition ratio in an InGaN layer was 0.8% in a light emitting device in which each semiconductor layer was formed on a thin GaN layer.
Figure 13:
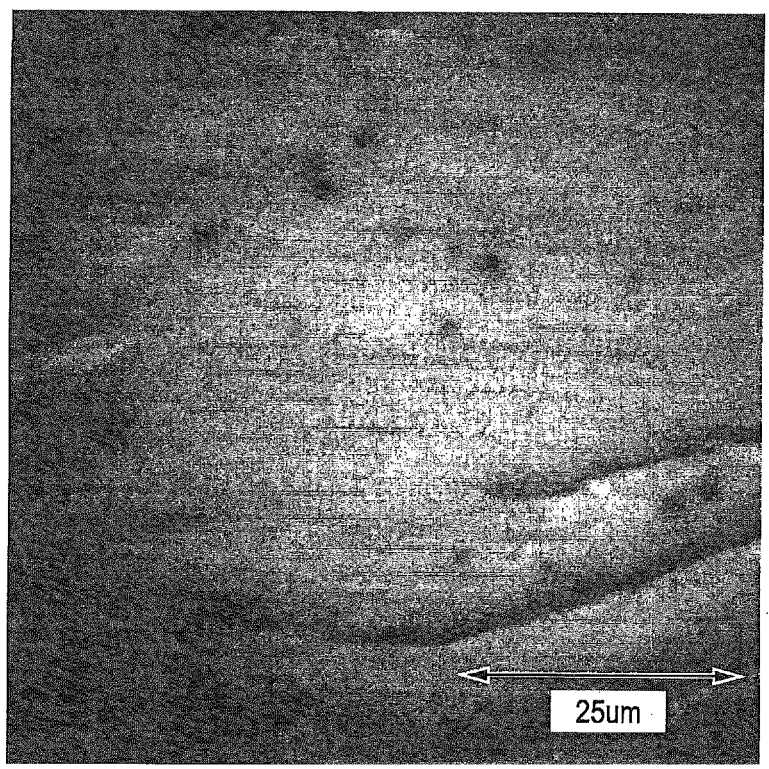
FIG. 13 is a photoluminescence photograph when an In composition ratio in an InGaN layer was 3.0% in a light emitting device in which each semiconductor layer was formed on a thin GaN layer.
Figure 14:
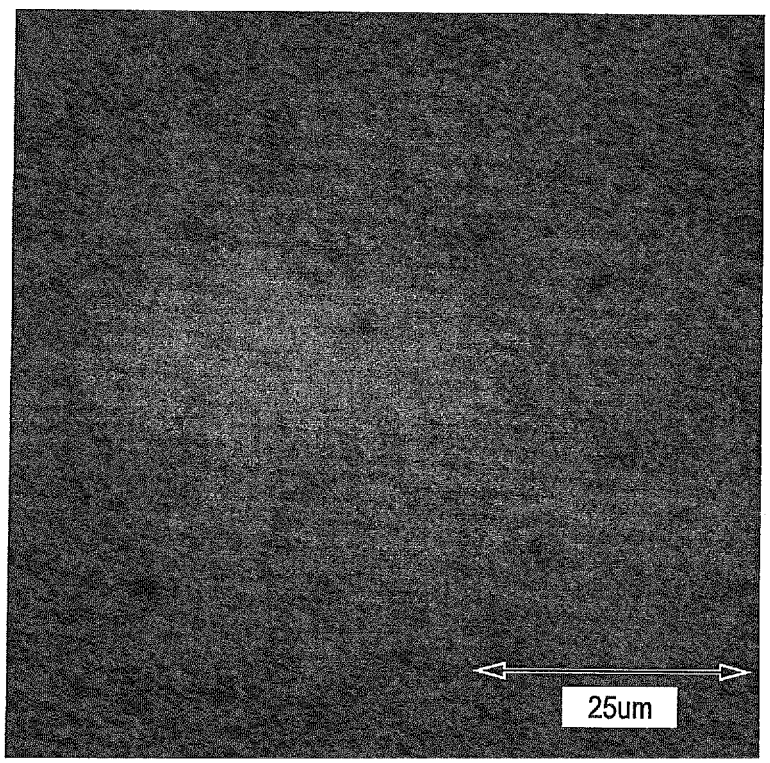
FIG. 14 is a photoluminescence photograph when an In composition ratio in an InGaN layer was 6.5% in a light emitting device in which each semiconductor layer was formed on a thin GaN layer.

FIGS. 12 to 14 show photoluminescence photographs in the case that the In composition ratio in the strain relaxation layer 40 (n-type InGaN layer) was changed. FIG. 12 is a photoluminescence photograph of the n-type InGaN layer when the In composition ratio in the strain relaxation layer 40 (n-type InGaN layer) is 0.8%. In this case, scotoma was not almost observed.

FIG. 13 is a photoluminescence photograph of the n-type InGaN layer when the In composition ratio in the strain relaxation layer 40 (n-type InGaN layer) is 3.0%. In this case, scotoma was observed although slight. The scotoma density was $6.0 \times 10^5$/cm$^2$.

FIG. 14 is a photoluminescence photograph of the n-type InGaN layer when the In composition ratio in the strain relaxation layer 40 (n-type InGaN layer) is 6.5%. In this case, scotoma was slightly observed. The scotoma density was $1.2 \times 10^6$/cm$^2$. In other words, the scotoma density in the case of FIG. 14 was 2 times the scotoma density in the case of FIG. 13.

6. Modification Example

In this embodiment, an n-type InGaN layer was used as the strain relaxation layer 40. However, the strain relaxation layer 40 may have superlattice structure. Examples of the superlattice structure include InGaN/GaN and AlInGaN/AlInGaN (including the case of AlInGaN/AlGaN). In the case of InGaN/GaN, average In composition ratio Y0 in the superlattice structure may be a range of 0%<Y0≤3% (the range of Table 1). The average In composition ratio Y0 may be ranges of Tables 2 and 3. In the case of AlInGaN/AlInGaN, regarding the lattice constant of a axis or c axis in the superlattice structure, average In composition ration Y1 in GaInN may be adjusted to a range of 0%<Y1≤3% (the range of Table 1). Furthermore, the Y1 may be adjusted to the ranges of Tables 2 and 3.

7. Summary

As described in detail above, the group III nitride compound semiconductor light emitting device of the present embodiment is produced using a thin GaN substrate as a growth substrate. In the group III nitride compound semiconductor light emitting device, the value of In composition ratio in the InGaN layer is small. Therefore, difference in lattice constant between the thin GaN substrate and the InGaN layer is small. Consequently, stress concentration due to the difference of lattice constant can be relaxed. As a result, occurrence of dislocation due to the stress concentration can be inhibited. In other words, even though a thin GaN substrate is used, dislocation due to strain does not almost occur in the InGaN layer.

The present embodiment is merely an exemplary example. Therefore, various improvements and modifications can be made within a scope that does not deviate from the gist. In the present embodiment, a metal organic chemical vapor deposition method (MOCVD) was used as an epitaxial growth method. However, a vapor phase epitaxial method such as a halide vapor phase epitaxy method (HVPE); a molecular beam epitaxy method (MBE); a liquid phase epitaxy method; and the like may be used.

What is claimed is:

1. A group III nitride compound semiconductor light emitting device, comprising:
    a GaN substrate;
    a support substrate supporting the GaN substrate;
    a light emitting layer;
    a first conductive semiconductor layer formed between the GaN substrate and the light emitting layer; and
    a second conductive semiconductor layer formed at a side opposite to the first conductive semiconductor layer through the light emitting layer,
    wherein the GaN substrate has a thickness in a range of from 10 nm to 10 μm,
    wherein the first conductive semiconductor layer contains an InGaN layer, and
    wherein the InGaN layer includes an n-type InGaN layer, and the n-type InGaN layer has an In composition ratio X in a range of from 0.1 to 2% such that a radiant flux is 99% or more of a total radiant flux, the total radiant flux being 100% when the In composition ratio X in the InGaN layer is 0.8%.

2. The group III nitride compound semiconductor light emitting device according to claim 1, wherein the GaN substrate has a thickness in a range of from 100 to 200 nm.

3. The group III nitride compound semiconductor light emitting device according to claim 1, wherein the n-type InGaN layer has the In composition ratio X in a range of from 0.5 to 1.5% such that the radiant flux is 99.5% or more of the total radiant flux.

4. The group III nitride compound semiconductor light emitting device according to claim 1, wherein the support substrate has a thickness in a range of from 1 mm to 3 mm.

5. The group III nitride compound semiconductor light emitting device according to claim 1, wherein the first conductive semiconductor layer has a thickness in a range from 500 angstroms to 2,500 angstroms such that the radiant flux is 95% or more of the total radiant flux, the total radiant flux being 100% when a thickness of the first conductive semiconductor layer is 1,500 angstroms.

6. The group III nitride compound semiconductor light emitting device according to claim 1, wherein the first conductive semiconductor layer has a thickness in a range from 1,000 angstroms to 2,000 angstroms such that the radiant flux is 99% or more of the total radiant flux, the total radiant flux being 100% when a thickness of the first conductive semiconductor layer is 1,500 angstroms.

7. The group III nitride compound semiconductor light emitting device according to claim 5, wherein the first conductive semiconductor layer has a thickness in a range from 1,000 angstroms to 2,000 angstroms such that the radiant flux is 99% or more of the total radiant flux.

8. The group III nitride compound semiconductor light emitting device according to claim 1, wherein the first conductive semiconductor layer has a superlattice structure.

9. A group III nitride compound semiconductor light emitting device, comprising:
- a GaN substrate;
- a support substrate supporting the GaN substrate;
- a light emitting layer;
- a first conductive semiconductor layer formed between the GaN substrate and the light emitting layer; and
- a second conductive semiconductor layer formed at a side opposite to the first conductive semiconductor layer through the light emitting layer, wherein the GaN substrate has a thickness in a range of from 10 nm to 10 μm, wherein the first conductive semiconductor layer contains an InGaN layer, wherein the InGaN layer includes an n-type InGaN layer, and the n-type InGaN layer has an In composition ratio X in a range of from 0.1 to 2%, and wherein the first conductive semiconductor layer has a thickness in a range from 1,000 angstroms to 2,000 angstroms such that a radiant flux is 99% or more of a total radiant flux, the total radiant flux being 100% when a thickness of the first conductive semiconductor layer is 1,500 angstroms.

10. The group III nitride compound semiconductor light emitting device according to claim 9, wherein the n-type InGaN layer has the In composition ratio X in the range of from 0.1 to 2%, such that the radiant flux is 99% or more of the total radiant flux, the total radiant flux being 100% when the In composition ratio X in the InGaN layer is 0.8%.

11. The group III nitride compound semiconductor light emitting device according to claim 10, wherein the n-type InGaN layer has the In composition ratio X in the range of from 0.5 to 1.5% such that the radiant flux is 99.5% or more of the total radiant flux.

* * * * *